United States Patent [19]

Marks et al.

[11] Patent Number: 4,648,669

[45] Date of Patent: Mar. 10, 1987

[54] REMOVABLE RETAINING AND GUIDE MEANS FOR ELECTRICAL SOCKETS

[75] Inventors: Richard L. Marks, Mechanicsburg; William T. Parker, Boiling Springs, both of Pa.

[73] Assignee: AMP Incorporated, Harrisburg, Pa.

[21] Appl. No.: 795,395

[22] Filed: Nov. 6, 1985

[51] Int. Cl.$^4$ ............................................. H01R 13/629
[52] U.S. Cl. .................................. 339/75 M; 339/74 R
[58] Field of Search ........................... 339/74 R, 75 M; 308/4 R, 4 C; 16/362, 248

[56] References Cited

U.S. PATENT DOCUMENTS

| | | | |
|---|---|---|---|
| 992,637 | 5/1911 | Bernot | 16/248 |
| 2,098,858 | 11/1937 | Busson et al. | 16/362 |
| 4,498,725 | 2/1985 | Bright et al. | 339/75 M |

*Primary Examiner*—John McQuade
*Attorney, Agent, or Firm*—Allan B. Osborne

[57] ABSTRACT

Removable retaining and guide means for retaining together a base member and slidable upper member of an electrical socket. The removable retaining and guide means include rigid pins received in hole-containing means of the base and upper members. The pins have upset portions which require a force so as to be passed through the holes and an intermediate portion on which the upper member can freely slide and which confines or guides the direction of travel.

7 Claims, 3 Drawing Figures

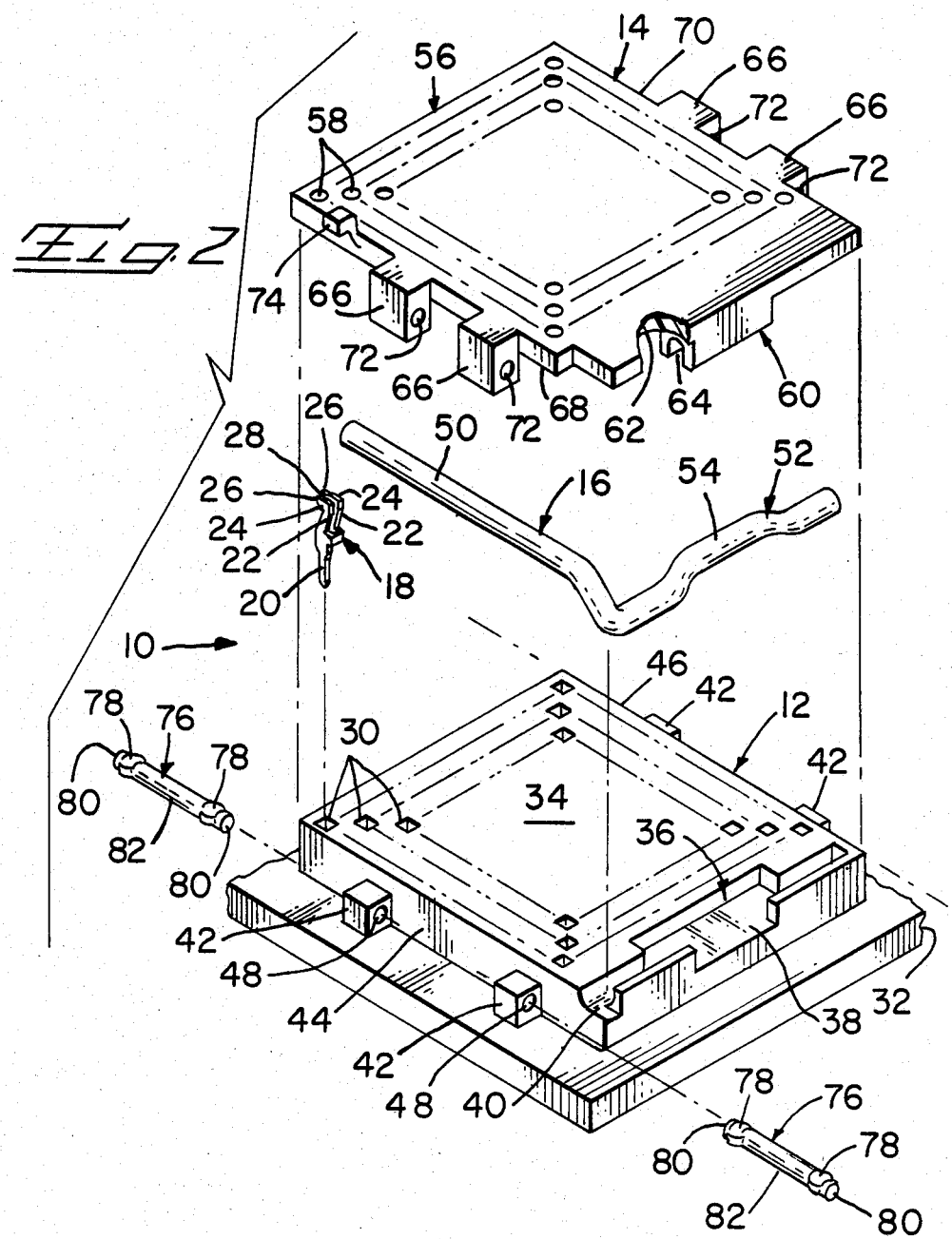

REMOVABLE RETAINING AND GUIDE MEANS FOR ELECTRICAL SOCKETS

FIELD OF THE INVENTION

This invention relates to electrical sockets and more particularly to electrical sockets soldered onto a circuit board and which must be partially dismantled to gain access to and remove damaged contact elements.

BACKGROUND OF THE INVENTION

Electrical sockets known as Level II sockets, are soldered to a circuit board and contain contact elements therein which removably receive leads or pins on electronic packages and provide electrical interconnections thereof to circuits and electronic packages and components on the board. Some of these sockets are low or zero insertion force types having a base member in which the contact elements are positioned and an upper member slidingly mounted on top of the base member and which must be removed to gain access to the contact elements. However, to maintain socket integrity, the upper member must be secured to the base member and accordingly the removal thereof to replace a damaged contact element is a difficult and time consuming operation. For example, in one contemporary Level II socket, the base member has elongated passages that are counterbored defining downwardly facing shoulders. Latch members in the form of resistent fingers are positioned within the respective passages when the upper and base members are elongated and upwardly facing shoulders of the resilient fingers engage the downwardly facing shoulders thereby retaining the upper and base members latchably together during the relative movement between the upper and base members. In some cases, complete desoldering of all the contact elements from the board may be required.

SUMMARY OF THE INVENTION

The objective in finding a solution to the above noted problem resulted in the present invention. Accordingly a removable retaining and guide means is provided for retaining an upper member to a base member and for guiding the upper member as it moves across the top of the base member.

This arrangement enables the upper member to be easily removed from the base member so that one or more damaged contact elements can be replaced.

According to the present invention, an electrical socket comprises a dielectric base member and a dielectric upper member slidably movable with respect to the base member. The base member has an array of contact-receiving cavities therein in which electrical contact members are secured. The electrical contact members have a contact section located within its respective cavity and a terminal section extending outwardly from a bottom surface of the base member for electrical connection with conductive members on a circuit board. The upper member has an array of holes therethrough corresponding to the array of cavities so that terminal sections of an electronic component extend through the respective holes for electrical connection with the respective contact sections of the electrical contacts when the upper member is moved relative to the base member from one position to another position. Retaining and guide means are provided by the base member and the upper member to retain the members together, to guide their relative movement and include members to be readily removed so that the upper member can be removed from the base member to check the contacts or replace damaged ones.

BRIEF DESCRIPTION OF THE DRAWINGS

FIG. 2 is an exploded perspective view of the socket shown in FIG. 1; and

DESCRIPTION OF THE INVENTION

Figure 1:
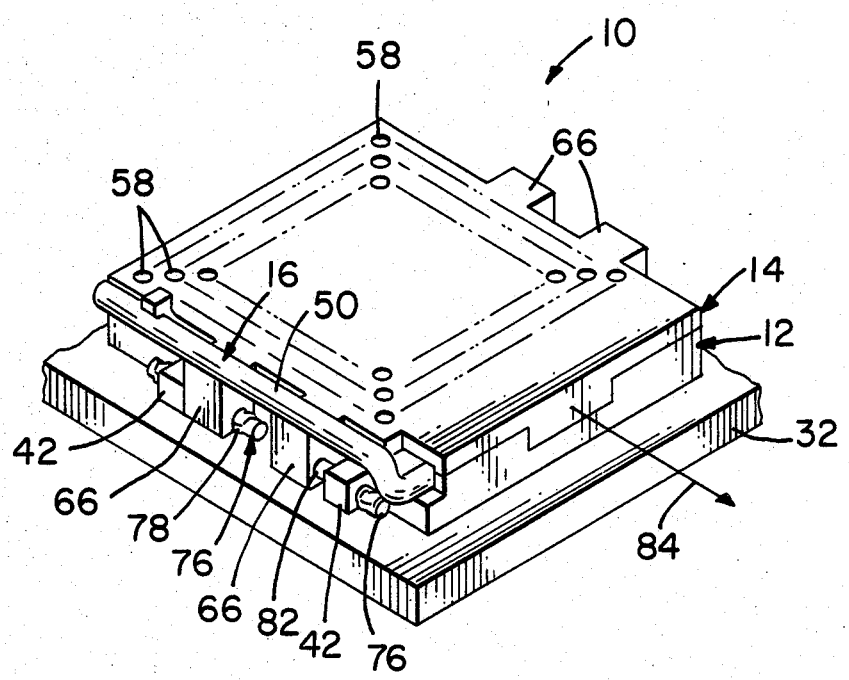
FIG. 1 is a perspective view of a Level II socket in which removable retaining and guide means of the present invention are incorporated.

The Level II electrical socket 10 shown in FIGS. 1 and 2 is of the type disclosed in U.S. Pat. No. 4,498,725, the disclosure of which is incorporated herein by reference, and includes base member 12, upper member 14, actuator 16 and a plurality of contact elements 18 (only one being shown in FIG. 2). Each element 18 includes lead 20, a pair of spaced apart, vertical arms 22 and, on top of each arm 22, finger 24 extending normally to the element's longitudinal axis. Free end 26 of one finger 24 converge towards the free end 26 of the other finger 24 to define a pin receiving contact area 28. Elements 18 are made by conventional stamping and forming from a copper alloy with suitable plating; e.g., tin lead or gold over nickel.

A plurality of cavities 30 in base member 12 receive contact elements 18 with leads 20 depending from member 12 for soldering in holes (not shown) in circuit board 32. With elements 18 in cavities 30, fingers 24 are located immediately below top surface 34 of member 12.

Groove 36 is provided in surface 34 with an enlarged middle portion 38 and an open end 40.

A pair of spaced apart blocks 42 are provided on opposing side walls 44, 46 of base member 12. A hole 48 extends through each block 42 on an axis parallel with top surface 34.

Actuator 16 includes handle 50 and crank 52. The latter includes off-set portion 54. Actuator 16 is preferably made from stainless steel.

Upper member 14 includes plate 56 which has the same length and width as base member 14. A plurality of holes 58 extending through plate 56 reflect in number and pattern, the cavities 30 which will receive elements 18. Cam block 60 depends from under-surface 62 of plate 56 at one end thereof and includes downwardly opened channel 64. A pair of spaced apart blocks 66 are attached to each side 68, 70 of plate 56 and extend below under-surface 62. Holes 72 which extend parallel to plate 56 are provided in each block 66. Latch 74 is provided on side 68 of plate 56.

Both base member 12 and upper member 14 are preferably molded from a glass filled nylon sold by General Electric Company under the trademark VALOX 420.

Pins 76 shown in FIGS. 1 and 2 comprise one embodiment of the removable retaining and guide means of the present invention. Each pin 76 includes upset portions 78 adjacent each end 80 and intermediate portion 82. The effective diameter of upset portions 78 is slightly greater than the diameter of holes 48, 72 and the diameter of intermediate portion 82 is slightly less than the hole diameter. Pins 76 are preferably made from stainless steel.

Socket 10 is assembled by placing contact elements 18 in cavities 30 with leads 20 depending from base member 12. Actuator 16 is added to base member 12, placing crank 52 in groove 36 with off-set portion 54 in middle portion 38 and with handle 50 extending along side wall 44.

Upper member 14 is placed on top of base member 12 with under-surface 62 slidingly resting on top surface 34. Channel 64 of cam block 60 fits down over off-set portion 54 of crank 52. Blocks 66 fit down along side walls 44, 46 and in between blocks 42 with holes 48, 72 being coincidental relative to each other. Pins 76 are inserted into holes 48, 72 of blocks 42, 66 respectively as shown in FIG. 1; i.e., upset portions 78 bracket blocks 42, 66, to retain upper member 14 to base member 12. As upset portions 78 are forced through holes 48, 72, the surrounding material gives to allow passage therethrough but recovers to the original diameter after upset portions 78 have passed through.

In operation, handle 50 of actuator 16 is resiliently bent around latch 74 and pivoted upwardly, which movement, through crank 52 and cam block 60, slides upper member 14 in the direction indicated by arrow 84 in FIG. 1. Leads or pins (not shown) depending from an electronic package (not shown) are inserted through holes 58 in upper member 14 and in between vertical arms 22 remote from contact area 28 defined by converging fingers 24. Actuator 16 is then pivoted downwardly and around latch 74 to hold it in place. The downward movement slides upper member 14 back in a direction opposite to arrow 84, forcing the aforementioned leads into contact areas 28 to establish electrical contact therebetween. As upper member 14 is being slid across top surface 34 of base member 12, intermediate portions 82 of pins 76 guide upper member 14 to prevent the leads being twisted and damaging contact elements 18. Upset portions 78 prevent pins 76 from working out of holes 48, 72.

In the event a contact element 18 does become damaged, pins 76 are withdrawn by gripping upset portions 78 with pliers (not shown), lifting upper member 14 off base member 12 and desoldering lead 20 on the damaged element 18. The damaged contact element 18 can then be removed from cavity 30 and a new element 18 substituted therefore. After soldering in lead 20 of the new element 18, replacing upper member 14 and pins 76, socket 10 is again operational.

Figure 3:
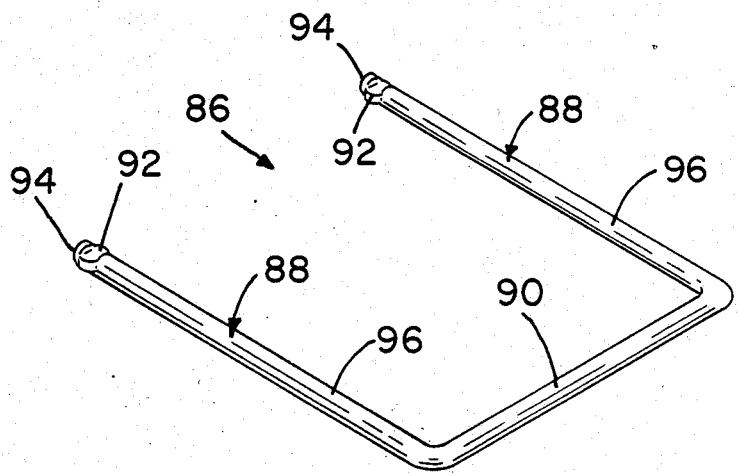
FIG. 3 is a perspective view of an alternative removable retaining and guide means.

FIG. 3 illustrates an alternative retaining and guide means. A single, U-shaped member 86 includes two parallel, elongated legs 88 joined by bight 90. Upset portions 92 are provided adjacent free ends 94 on each leg 88. Intermediate portions 96 are provided between bight 90 and each upset portion 92.

Member 86 is a direct substitute for pins 76; i.e., no modifications need to be made to either base member 12 or upper member 14. In use, legs 88 of member 86 is slid through holes 48, 72 in blocks 42, 66 respectively from an end of socket 10 with withdrawal being the reverse thereof. As with pins 76, upset portions 92 prevent member 86 from backing out through holes 48, 72 and intermediate portions 96 guide upper member 14. Member 86 is preferably made from stainless steel.

As can be discerned, an electrical socket has been disclosed that includes a retaining and guide means that retains upper and base members together, guides their relative movement during the operation of the socket and includes removable means so that the upper member can be removed from the lower member to check the contact members and to replace damaged ones.

We claim:

1. Removable retaining and guide means for electrical sockets of the type having an upper member slidably positioned on a base member and each member having hole-containing means with said means on the upper member being in alignment with said means on the base member so that the holes therein are coincidental one to the other, said removable retaining and guide means comprising a rigid pin received in said holes and having upset portions adjacent each end and guide means intermediate said upset portions, said upset portions being larger than said holes so that a reasonable force is required to pass said upset portions therethrough, thereby removably retaining said upper member to said base member and said guide means being smaller than said holes so that said upper member slides freely thereon and is guided thereby.

2. Removable retaining and guide means for electrical sockets of the type having an upper member slidably positioned on a base member and each member having hole-containing means on two opposing sides with said means on the upper member being in alignment with said means on the base member so that the holes therein on each side are coincidental one to the other, said removable retaining and guide means comprising a rigid member having a pair of spaced apart, parallel legs joined at one end by a bight, said member being attached to said socket with said bight extending across an end thereof and said legs removably and slidably received in holes in the hole-containing means on each opposing side to guide said upper member sliding thereon, said legs further having retaining means adjacent each free end for retaining said legs in said holes and thereby retain said upper member on said base member.

3. The removable retaining and guide means of claim 2 wherein said retaining means include upset portions adjacent free ends on said legs, said upset portions being larger than said holes so that a force is required to pass said upset portions through said holes.

4. The removable retaining and guide means of claim 3 wherein said guide means include portions on said legs intermediate said upset portions and said bight and having a smaller diameter than said holes.

5. An electrical socket for receiving pins of an electronic component and for electrically connecting the pins to electrical contact members of the socket, comprising:

a dielectric base member having an array of contact-receiving cavities therein;

electrical contact members in said array of contact-receiving cavities and including contact sections in respective contact-receiving cavities and terminal sections extending outwardly from the base member;

an upper member positioned on said base member and being slidable with respect to said base member, said upper member having an array of holes therethrough corresponding to the array of contact-receiving cavities so that the pins of the electronic component can extend through the respective holes of the upper member into the contact-receiving cavities;

means for moving the upper member relative to the base member to move the pins into electrical contact with the contact sections of the contact members;

interfingering blocks, each containing holes positioned on said upper and base members so that said holes are coincidental; and rigid pin means slidably extending through said holes to removably retain said upper and base members together and to guide said upper member which slides thereon, said pin means having upset portions thereon with said upset portions being dimensioned to pass through said holes with difficulty but without causing damage thereto.

6. The electrical socket of claim 5 wherein said hole-containing blocks are provided on opposing sides of said upper and base members and said pin means include a rigid member having a pair of parallel legs joined at one end by a bight, said member being attached to said socket with said bight extending across an end thereof and said legs removably received in said holes on each opposing side.

7. The electrical socket of claim 6 wherein said legs include upset portions adjacent each free end thereof, said upset portions being larger than said holes so that a force is required to pass said upset portions through said holes.

* * * * *